(12) United States Patent
Liu et al.

(10) Patent No.: US 7,547,757 B2
(45) Date of Patent: Jun. 16, 2009

(54) METHODS FOR MANUFACTURING ARYL-ARYL COUPLED POLYMERS

(75) Inventors: Changkun Liu, Lawrenceville, NJ (US); Bing Zhou, Cranbury, NJ (US)

(73) Assignee: Headwaters Technology Innovation, LLC, Lawrenceville, NJ (US)

( * ) Notice: Subject to any disclaimer, the term of this patent is extended or adjusted under 35 U.S.C. 154(b) by 292 days.

(21) Appl. No.: 11/461,608

(22) Filed: Aug. 1, 2006

(65) Prior Publication Data

US 2008/0033146 A1 Feb. 7, 2008

(51) Int. Cl.
*C08G 79/02* (2006.01)
*C08G 79/00* (2006.01)

(52) U.S. Cl. .................. 528/398; 528/394; 528/487; 528/502 R

(58) Field of Classification Search .................. 528/398, 528/394, 487, 502 R
See application file for complete search history.

(56) References Cited

U.S. PATENT DOCUMENTS

| | | | | |
|---|---|---|---|---|
| 3,769,352 | A | 10/1973 | Romanelli | 568/690 |
| 4,831,183 | A | 5/1989 | Hanes | 568/690 |
| 5,254,782 | A | 10/1993 | Schaart et al. | 585/509 |
| 5,777,070 | A | 7/1998 | Inbasekaran et al. | 528/394 |
| 5,919,930 | A | 7/1999 | Haber et al. | 544/238 |
| 6,376,690 | B1 | 4/2002 | Grubbs et al. | |
| 6,881,490 | B2 | 4/2005 | Kambe et al. | 428/447 |
| 6,887,972 | B2 | 5/2005 | Huang et al. | 528/422 |
| 2003/0165713 | A1 | 9/2003 | Oguma et al. | 428/690 |
| 2004/0241496 | A1 | 12/2004 | Zheng et al. | 428/690 |
| 2004/0254336 | A1 | 12/2004 | Xiao et al. | |
| 2005/0186445 | A1 | 8/2005 | Zheng et al. | 428/690 |
| 2005/0263758 | A1 | 12/2005 | Treacher et al. | 257/40 |
| 2006/0009614 | A1 | 1/2006 | Yamahara et al. | 528/380 |
| 2006/0037912 | A1 | 2/2006 | Wertsching et al. | |

FOREIGN PATENT DOCUMENTS

| | | |
|---|---|---|
| EP | 218100 | 4/1987 |
| EP | 337572 | 10/1989 |

*Primary Examiner*—Duc Truong
(74) *Attorney, Agent, or Firm*—Workman Nydegger

(57) ABSTRACT

Aryl-aryl coupled polymers are manufactured using a water-soluble noble metal catalyst. The hydrophilicity of the catalyst facilitates the separation of the catalyst from the polymer product. The method can be generally carried out by preparing a reaction medium comprising an aqueous phase and an organic phase. A water-soluble noble metal catalyst is dispersed in the aqueous phase. A base is also dispersed in the aqueous phase. An aryl-aryl coupled polymer is formed in the reaction medium by (i) adding at least one polymerizable monomer to the reaction mixture; and (ii) mixing the aqueous phase with the organic phase to cause polymerization of the monomer through an aryl-aryl coupling reaction. The polymer has a greater solubility in the organic phase than the aqueous phase. Allowing the organic phase to separate from the aqueous phase separates the water soluble catalyst from the polymer. The reaction can be used to manufacture high molecular weight polymers (e.g. at least 10,000 g/mole) with low quantities of residual metal (e.g. less than 20 ppm).

24 Claims, No Drawings

METHODS FOR MANUFACTURING ARYL-ARYL COUPLED POLYMERS

BACKGROUND OF THE INVENTION

1. The Field of the Invention

The present invention relates to methods for manufacturing aryl-aryl coupled polymers using a noble metal catalyst. More particularly, the present invention relates to the manufacture of aryl-aryl coupled polymers and the subsequent separation of the catalyst from the polymer product.

2. The Relevant Technology

The invention relates to the preparation of aryl-aryl coupled polymers. These compounds are of major importance in the high-growth area of conductive or conjugated organic polymers. For example, conductive polymers are important in applications such as polymeric light-emitting diodes, organic solar cells, and organic integrated circuits (ICs).

Currently, conductive polymers have a limited lifetime. Polymer lifetime is possibly the most important issue that determines whether a conductive organic polymer can be used commercially in a particular technology. Recent research shows that the molecular weight and the purity of the polymer are key factors that determine the lifetime of the polymer. In particular, the level of residual noble metal in polymer has a significant effect on lifespan. This is particularly true of blue emitting polymers used in PLED applications.

Conductive polymers can be synthesized by Yamamoto or Suzuki coupling reactions. The Suzuki reaction has been found to be a suitable reaction for the preparation of aryl-aryl coupled conductive polymers. The Suzuki reaction involves the hetero coupling of a halide- or sulphonoxy-functional aromatic compound with a compound containing an aryl-boron functionality in the presence of a base, a palladium compound, and a solvent.

Several variations of the reaction parameters are known. Generally, it is usual to carry out the reaction using two phases: an aqueous phase containing a base and a non-polar organic phase containing the starting compounds and the palladium catalyst. The palladium catalyst is typically a noble metal complexed with a hydrophobic phosphine compound. The solvent used as the non-polar organic phase is typically a solvent such as benzene, toluene, or xylene. The reaction produces a hydrophobic polymer that is soluble in the organic phase.

A significant problem with existing methods of manufacturing conducting polymers using Suzuki coupling is the difficulty in removing the catalyst from the polymer. Since the catalyst is soluble in the same phase as the polymer product, expensive and tedious techniques are required to remove enough metal for the polymers to be used in a commercial application. The difficulty and expense of removing residual noble metal catalysts from polymers manufactured using the Suzuki reaction is a significant impediment to achieving suitable polymer lifetime and economic viability for the use of the polymer in commercial applications.

BRIEF SUMMARY OF THE INVENTION

The present invention is directed to the manufacture of aryl-aryl coupled polymers using water-soluble noble metal catalysts and the separation of the catalyst from the polymers. The catalysts include noble metal atoms complexed with water-soluble organic ligands (e.g. sulphonic acid substituted triphenylphosphines). The hydrophilic characteristic of the catalyst facilitates the separation of the catalyst from the polymer product in the method of the present invention.

The method can be generally carried out by preparing a reaction medium comprising an aqueous phase and an organic phase. The aqueous phase includes water and optionally one or more polar organic solvents. The organic phase includes non-polar organic solvents or other organic solvents that are not completely miscible in water. The water-soluble noble metal catalyst is dispersed in the aqueous phase. A base is also dispersed in the aqueous phase.

An aryl-aryl coupled polymer having a molecular weight greater than about 1000 g/mol is formed in the reaction medium by (i) providing at least one polymerizable monomer; (ii) adding the polymerizable monomer to the reaction mixture; and (iii) mixing the aqueous phase with the organic phase to cause polymerization of the monomer through an aryl-aryl coupling reaction, thereby yielding a polymer having a molecular weight greater than 1000 g/mol and a greater solubility in the organic phase than the aqueous phase.

The water-soluble catalyst is separated from the polymer product by allowing the aqueous phase containing the catalyst to separate from the organic phase containing the polymer product. Surprisingly, the polymer can be obtained in very high molecular weights (e.g. 10,000 g/mol-250,000 g/mol) with high yields (e.g. 90%-95%). These high molecular weights and high yields are unexpected since the palladium catalyst is water soluble. This is particularly true for reactions using hydrophobic monomers. Quite surprisingly, high molecular weight and high yields have been achieved even where all the monomers used in the reaction are hydrophobic. The present invention provides the advantage of making high molecular weight aryl-aryl coupled polymers that can be easily separated from the noble metal catalyst by phase separation of the reaction mixture. Furthermore, because the catalyst and polymer can be readily separated in the reaction medium, the catalyst can be reused in subsequent reactions.

The polymers manufactured according to present invention have a relatively low concentration of residual catalyst (e.g. less than 100 ppm).

These and other advantages and features of the present invention will become more fully apparent from the following description and appended claims as set forth hereinafter.

DETAILED DESCRIPTION OF EXEMPLARY EMBODIMENTS

I. INTRODUCTION AND DEFINITIONS

The present invention is directed to the manufacture of aryl-aryl coupled polymers using water-soluble noble metal catalysts and the ease of separating the catalyst from the polymers. The method can be generally carried out by preparing a reaction medium comprising an aqueous phase and an organic phase. A water-soluble noble metal catalyst is dispersed in the aqueous phase. A base is also dispersed in the aqueous phase. An aryl-aryl coupled polymer is formed in the reaction medium by (i) adding at least one polymerizable monomer to the reaction mixture; and (ii) mixing the aqueous phase with the organic phase to cause polymerization of the monomer through an aryl-aryl coupling reaction. The reaction can be used to manufacture high molecular weight polymers (e.g. at least 10,000 g/mole). The polymer has a greater solubility in the organic phase than the aqueous phase. Allowing the organic phase to separate from the aqueous phase separates the water soluble catalyst from the hydrophobic polymer.

For purposes of the present invention, water-miscible solvents are solvents where no phase separation is discernable when at least 5% water is present in the solvent at room temperature or when at least 5% solvent is present in water at room temperature.

For purposes of the present invention, water-immiscible solvents are solvents that form a discernable phase separation when less than 5% solvent is present in water at room temperature.

II. COMPONENTS USED TO MANUFACTURE ARYL-ARYL COUPLED POLYMERS

A. Reaction Medium

The reaction medium provides a solution for dissolving the catalyst and monomers and for carrying out the polymerization reaction. The reaction medium also facilitates separation of the catalyst and the polymer product. The reaction medium includes an aqueous phase and an organic phase.

1. Aqueous Phase

The aqueous phase is primarily composed of water. The aqueous phase can also include a base. Examples of suitable bases that can be used in the reaction of the present invention include alkali metal and alkaline earth metal hydroxides, alkali metal and alkaline earth metal carbonates, alkali metal and alkaline earth metal phosphates, alkali metal hydrogen carbonates, alkali metal and alkaline earth metal acetates, alkali metal and alkaline earth metal alcoholates, and also primary, secondary and tertiary amines.

Preferred bases include alkali metal and alkaline earth metal hydroxides, alkali metal and alkaline earth metal carbonates and alkali metal hydrogen carbonates, alkali metal and alkaline earth metal phosphates. Most preferred bases include alkali metal carbonates and alkali metal hydrogen carbonates such as lithium carbonate, sodium carbonate, sodium bicarbonate, and potassium carbonate, and also alkali metal phosphates such as sodium phosphates tribasic and potassium phosphate tribasic.

The base can be used in a proportion of from about 100 to about 1,000 mol %, more preferably from about 100 to about 500 mol %, and most preferably from about 150 to about 400 mol %, based on the monomer.

The concentration of the base is primarily selected to optimize the aryl-aryl coupling reaction. However, the base can also be selected so as to modify the solubility of various organic solvents in the aqueous phase. As discussed below the base can be added to the aqueous phase to lower the solubility of some organic solvents (e.g. THF) in the aqueous phase.

2. Organic Phase

The organic phase is the portion of the reaction mixture that is not dissolved in the aqueous phase. The organic phase includes one or more organic solvents that are not completely miscible in the aqueous phase. Examples of suitable organic solvents include aliphatic hydrocarbons such as hexane, isohexane, heptane, and cyclohexane; aromatic hydrocarbons such as benzene, toluene, and xylene; higher alcohols not completely miscible with water, such as hexanol; and ethers such as anisole and THF. Preferred organic solvents are hydrocarbons, such as cyclohexane, benzene, toluene, xylene; ethers such as anisole and THF; and mixtures thereof The solubility of the organic solvent in the aqueous phase can depend on the type and concentration of solutes in the aqueous phase. For example, the addition of base to the aqueous phase reduces the solubility of electron rich polar organic solvents.

The solubility of the organic solvent can also depend on the amount and type of monomers added to the reaction mixture and the concentration and type of polymer being manufactured. Hydrophobic monomers that dissolve in the organic solvent tend to reduce the solubility of the organic solvent in the aqueous phase.

Hydrophobic polymer product formed during the polymerization reaction also tends to lower the solubility of the organic solvents in the aqueous phase. Reducing the water-solubility of the organic solvent as the polymerization reaction nears completion can be advantageous since it facilitates separation of the catalyst from the polymer product after the reaction, but allows more intimate contact of the catalyst and monomers during the reaction. In an exemplary embodiment, the organic phase includes at least one organic solvent with a water solubility greater than 5 wt %, more preferably greater than 10 wt %. In this embodiment, the phase separation is made possible by (i) adding one or more solutes to the aqueous phase, (ii) adding one or more hydrophobic monomers to the organic solvent, and/or (iii) formation of polymer product that dissolves in the organic solvent.

3. Water-Miscible Organic Solvents

The reaction mixture can optionally include water-miscible organic solvents as a co-solvent. Examples of suitable organic co-solvents miscible with the aqueous phase are nitrites such as acetonitrile, formamides such as DMF, lower alcohols such as methanol and ethanol, sulfoxides such as DMSO, and cyclic ethers such as THF and dioxane.

As mentioned above, the presence of solutes in the aqueous phase and/or the organic phase can affect the solubility of a solvent in the aqueous phase. Consequently, under some reaction conditions a particular solvent (e.g. THF) may be the primary component of the organic phase while in other reactions the same solvent may remain highly or completely soluble in the aqueous phase and therefore be more suitable as a co-solvent.

B. Water Soluble Catalysts

The catalysts used in the present invention are water soluble and capable of catalyzing an aryl-aryl coupling reaction (e.g. a Suzuki coupling reaction). The catalysts are organometallic complexes of a noble metal and a water-soluble complexing ligand (e.g. triphenylphosphine sulfonates). The catalyst complexes are formed by reacting a noble metal compound (e.g. a palladium salt) with the water soluble complexing ligand.

In a preferred embodiment, the noble metal is provided as a platinum or palladium compound. Preferred noble metal compounds include palladium salts, including palladium ketonates, palladium acetylacetonates, (nitrile)palladium halides, (olefin)palladium halides, palladium halides, allylpalladium halides and palladium biscarboxylates. Preferred palladium metals include $Pd(OAc)_2$, $Pd(acac)_2$, and/or $PdCl_2$.

Water-soluble complexing ligands are organic compounds that provide catalytic selectivity for the desired aryl-aryl coupling reaction (e.g. ligands such as triphenylphosphine for use in a Suzuki coupling reaction). The complexing ligands are substituted with a polar functional group to provide water solubility. Examples of suitable polar functional groups that can be added to suitable organic ligands include sulfonic acid groups, carbonic acid groups, phosphonic acid groups, phosphonium groups, peralkylammonium groups, hydroxy groups, polyether groups having an appropriate chain length, salts thereof, and combinations thereof.

Preferred classes of water-soluble complexing ligands are the following types of compound substituted by the above groups: phosphines such as trialkylphosphines, tricycloalkylphosphines, triarylphosphines, dialkylarylphosphines, alkyldiarylphosphines and heteroarylphosphines such as tripyridylphosphine and trifurylphosphine, where the three substituents on the phosphorus can be identical or different, chiral or achiral, where one or more of the ligands can link the phosphorus groups of a plurality of phosphines, and where a part of this linkage can also be one or more metal atoms, phosphites, phosphinous esters and phosphinous esters, phosphols, dibenzophosphols and cyclic or oligocyclic and polycyclic compounds containing phosphorus atoms.

Further suitable groups of complexing ligands include, for example, bipyridines, phenanthrolines, porphyrins and alizarins which are modified with one or more of the above-mentioned polar functional groups.

Examples of preferred water-soluble complexing ligands include the following: (i) sulfonated phosphines, including sulfonated phosphines having the following formula: $R_{3-n}P$ $(p-c_6H_4SO_3K)_n$, $R=C_6H_5$, 2-pyridyl, 3-pyridyl; n=1-3 P[p-$OC_6H_4SO_3$ $(NH(i-octyl)_3]_3$; (ii) phosphines having hydrophilic groups in the periphery; (iii) phosphines having quaternized aminoalkyl and aminoaryl substituents; (iv) carboxylated phosphines; (v) Phosphates having hydroxyalkyl or polyether substituents; (vi) phosphinoalkylphosphonium salts; (vii) phosphites;

The more preferred water-soluble complexing ligands are triphenylphosphine sulfonate (TPPMS), triphenylphosphine disulfonate (TPPDS), triphenylphosphine trisulfonate (TPPTS), (1-N,N,N-trimethyl)amino-2-diphenylphosphinoethane iodide (AMPHOS), sodium tetrasulfonated-[2,2'-bis (diphenylphosphinomethyl)]-1,1'-biphenyl (BISBI), sodium 4,7-di-(p-sulfonated)phenyl-1,10-phenanthronline (PHEN). The ligands TPPMS, TPPDS, and TPPTS are the most preferred complexing ligands due to their superior performance in the catalytic reaction of the present invention. If desired, mixtures of two or more different water-soluble complexing ligands can also be used. Additional suitable complexing ligands are described in U.S. Pat. No. 5,919,930 to Haber et al., which is hereby incorporated by reference.

C. Polymerizable Monomers

Monomers suitable for use in the present invention are aryl containing compounds that are capable of reacting to form aryl-aryl coupled polymers. The monomers include, or can be reacted to include, two or more functional groups that allow polymerization to occur. The polymerizable functional groups can be the same or different. Monomers with two different groups are typically referred to as AB monomers. Suitable groups for carrying out the polymerization of the monomers under Suzuki conditions include, for example, aromatic boron-containing groups, aromatic halogen-containing groups, perfluoroalkylsulfonate groups, and combinations of these. The monomers preferably have two aromatic boron-containing groups or two of either an aromatic halogen-containing group or a perfluoroalkylsulfonate group.

Examples of suitable polymerizable monomers include, but are not limited to, 9,9-dioctylfluorene-2,7-bis-(trimethylborate), 9,9-dioctyl-2,7-dibromofluorene, 4-(3-methylpropyl)-N,N-bis(4-bromophenyl)aniline, 3,4-dibromothiophene, 4,7-dibromo-2,1,3-benzothiadiazole, and combinations of these. Those skilled in the art will recognize that there are other suitable monomers and that the foregoing monomers can be modified in various ways and still be used as a polymerizable monomer in the reaction of the present invention.

It will be appreciated that the term "monomer" includes polymerizable units that may not strictly be single, unreacted units, but partially polymerized units (e.g. dimers, trimers, oligomers) that can be further polymerized to form the final polymer of desired molecular weight.

III. PROCESS FOR MANUFACTURING ARYL-ARYL COUPLED POLYMERS

The process for manufacturing aryl-aryl coupled polymers according to the present invention generally includes preparing the reaction medium, preparing the water-soluble catalyst complex, polymerizing the monomers to form polymers, and separating the water-soluble catalyst from the polymer product.

A. Preparation of Reaction Medium

The reaction medium is prepared by selecting at least one organic solvent. The organic phase is selected such that the polymer product will have a greater solubility therein than in the aqueous phase. The particular solvents used will depend on the particular water-soluble catalyst being used and the particular product formed in the polymerization reaction. By selecting an appropriate organic phase, the reaction medium can facilitate the separation of the polymer product and the water-soluble catalyst.

In the process according to the present invention, the reaction medium typically includes the aqueous phase in an amount from about 1% to about 90% by volume (based on the total volume of the reaction mixture), more preferably from about 10% to about 75%, and most preferably from about 25% to about 75%. The water content of the aqueous phase is typically from about 1% to about 90% by volume (based on the total volume of the aqueous phase), more preferably from about 10% to about 75%, and most preferably from about 25% to about 75%.

The reaction medium typically includes a base (e.g. for Suzuki reaction). The base can be used in a proportion of from about 100 to about 1,000 mol %, more preferably from about 100 to about 500 mol %, and most preferably from about 150 to about 400 mol %, based on the monomer.

B. Preparation of Water-Soluble Catalyst

The water soluble catalyst is prepared by selecting a noble metal compound (e.g. a palladium salt) and reacting the metal compound with the water-soluble complexing ligands. Typically the water-soluble catalyst is prepared in-situ by dissolving the metal compound and ligands in the reaction medium. However, if desired, the water-soluble catalyst can be formed in a separate reaction and then mixed with the reaction medium.

In the process according to the invention, the metal compound is usually employed in an amount of from about 0.00001 mol % to about 5 mol % (palladium), based on the amount of C—C links to be closed. Preference is given here to the range from about 0.001% to about 2%, especially the range from about 0.001% to about 1%.

The water-soluble complexing ligand is typically added to the reaction mixture in a ratio of ligand to metal in a range from about 1:1 to about 20:1, more preferably from about 2:1 to about 15:1, and most preferably from about 4:1 to about 12:1.

The water-soluble catalyst is used in the process of the invention in a proportion of from about 0.001 to about 10 mol %, preferably about 0.01 mol % to about 5 mol %, particularly preferably from about 0.05 to about 3 mol %, more preferably from about 0.1 to about 1.5 mol %, based on the concentration of the monomer.

In some cases the metal compound may be initially soluble in the organic phase. The water-soluble ligands will be soluble in the aqueous phase. In this case, stirring the organic and aqueous phases together can facilitate the reaction between the metal compound and the complexing ligands. The metal will be drawn into the aqueous phase as it forms a complex with the water-soluble ligands.

The water-soluble catalyst is dispersed in the aqueous phase. In the case where the catalyst is formed ex-situ, the water-soluble catalyst can be dispersed in the aqueous phase by simply mixing the catalyst with the aqueous phase. In the case where the catalyst is formed in-situ, the water-soluble catalyst is dispersed in the aqueous phase as the palladium compound reacts with the water-soluble ligands.

C. Polymerization of Monomers to Form Polymers

To carry out the polymerization process of the invention, one or more monomers are selected and added to the reaction mixture. In a preferred embodiment, the polymerizable monomer or monomers include at least one aromatic boron-containing group and at least one aromatic halogen-containing group or perfluoroalkylsulfonate group. The monomers can be selected to be soluble in the aqueous phase or the organic phase of the reaction medium.

The monomers are reacted by combining the monomers, base (if needed), metal compound, complexing ligands, and any other components in the reaction medium in any order. The particular phase to which the individual components are added will depend on the solubility that the component has in either phase of the reaction medium.

During the reaction, the aqueous and organic phases are vigorously stirred to bring the components of the reaction into contact with one another. The water soluble catalyst causes polymerization of the monomers through an aryl-aryl coupling reaction. The polymerization reaction forms a hydrophobic polymer that is insoluble in the aqueous phase so as to remain in or be preferentially transferred into the organic phase (i.e., a polymer that is more soluble in the organic phase than in the aqueous phase). In some cases, particularly where very high molecular weight is achieved, a small portion of the polymer may precipitate out of the organic phase.

In an exemplary embodiment, formation of the polymer and its dissolution in the organic solvent reduces the solubility of the organic solvent in the aqueous phase, thereby facilitating the separation of the organic phase from the aqueous phase. In an exemplary embodiment, the solubility of the organic solvent in the aqueous phase is reduced to less than 10 wt %, more preferably less than 5 wt %.

Surprisingly, the aryl-aryl coupling reaction to form high molecular weight polymers using water-soluble noble metal catalyst complexes can be carried out with good yields (e.g. 90-95%). Furthermore, these yields can typically be achieved without an excess of an aryl-boron compound. In addition, the reaction has surprisingly been found to have good yields even where the starting monomers are non-polar or a combination of non-polar and polar monomers.

The method of the present invention is preferably carried out so as to yield a polymer having a molecular weight greater than 1000 g/mol. In a more preferred embodiment, the aryl-aryl coupled polymer product has a molecular weight greater than about 5,000 g/mol, even more preferably greater than about 10,000 g/mol. In some applications, it can be advantageous to form polymers with a molecular weight greater than about 50,000 g/mol. The methods of the present invention have been observed to produce polymers with a molecular weight as high as 85,000 g/mol and are believed to be suitable for producing molecular weights of about 150,000 g/mol. Higher molecular weight polymers are particularly advantageous where good conduction is necessary since higher molecular weights can result in polymers with a lower incidence of electrical shorts.

The concentrations of the reaction components depend on the particular polymer being synthesized. Because of the increase in viscosity associated with forming polymers, the polymerization reactions are typically carried out at concentrations in the range of about 1 mol/l or less of monomer, although higher concentration ranges may be used if the mixture can be properly mixed.

Depending on the monomers, water-soluble catalyst, reaction medium, and reaction duration, the reaction can be carried out at a temperature in a range of about 0° C. to about 200° C., preferably from about 30° C. to about 170° C., more preferably from about from about 50° C. to about 150° C., and most preferably at from about 60° C. to about 120° C. Typically, the reaction is carried out for a period of from about 1 hour to about 100 hours, more preferably from about 5 hours to about 70 hours, and most preferably from about 5 hours to about 50 hours.

The methods of the present invention can be used to form homopolymers, heteropolymers (e.g. random co-polymers) and/or block co-polymers. Homopolymers are manufactured by selecting and reacting a single polymerizable monomer. Heteropolymers and other co-polymers can be manufactured by selecting and reacting two or more polymerizable monomers.

In one embodiment of the invention, the polymerization is carried out in at least two steps, an excess of one of the monomers being employed in the first step so that a short-chain polymer having a first composition is formed. "Short-chain" herein means there is only formed, at first, an oligomer having a few (for example, between 3 and 20) repeating units. The remaining monomers are subsequently added in one or more further step(s) so that finally the ratio of, for example, boron-containing reactive groups and halogen- or sulphonyloxy-containing reactive groups is 1:1.

A block-like structure can be formed by subsequently reacting a second monomer in a second step. A "block-like structure" herein means that as a result of the first step there is formed, for example, an oligomer having the sequence $B(AB)_n$ where A and B are the two monomer units used, B being the monomer used in excess and n being the average length of those oligomers. Subsequently, a monomer C can be added so that the total number of reactive end groups is balanced out. This results finally in a polymer mainly comprising sequences as follows: $(C[B(AB)_n])_m$ wherein m is the average chain length of the polymer thereby defined; that is to say blocks having the structure $B(AB)_n$ alternate with C and the polymer has a block-like structure. Of course, it is also possible, depending on the sequence of monomer addition, to produce further block-like structures by means of the process described.

Examples of polymers that can be manufactured using the method of the present invention include poly(9,9-dioctylfluorene-co-benzothiadiazole), poly(9,9-dioctylfluorene-3,4-thiophene), poly[2,7-(9,9-dioctylfluorene)-co-N-(4-(3-methylpropyl)-diphenylaniline, and poly[2,7-(9,9-dioctylfluorene)].

D. Separating Catalyst Metals from Aryl-Aryl Coupled Polymer

The process of the invention includes the step of separating at least a portion of the polymer product from the water-soluble catalyst by allowing or causing the aqueous and organic phases to separate. Because the aryl-aryl coupled polymers manufactured in the method of the present invention are soluble in the organic phase and the water-soluble catalysts are soluble in the aqueous phase, separating the aqueous and organic phases causes separation of the polymers and catalyst. In addition, any excess water soluble ligand can be separated out from the polymer product as part of aqueous phase. The use of a water-soluble catalyst in the reaction medium according to the present invention makes it possible to perform a very efficient separation between the catalyst and the polymer product. This advantageous separation technique can reduce the complexity of purifying the finished polymer and reduce the chance that polymer will be lost or damaged during the process. In addition, the process of the present invention can reduce cost as compared to other more complicated separation techniques.

While the method of the present invention can efficiently remove a large portion of the metal catalyst and/or complexing ligands, some residual catalyst may be present. The amount of residual metal catalyst is typically between about 100 ppm and about 10 ppm. The residual metal can be removed, if desired, using known techniques (e.g. by recrystallization, Soxhlet extraction, scavenger absorption, sublimation, or chromatography).

IV. EXAMPLES

The following are formulas for producing high molecular weight polymers according to the methods of the present invention. Examples 1-6 describe methods for manufacturing a high molecular weight poly[2,7-(9,9-dioctylfluorene)] according to the following equation:

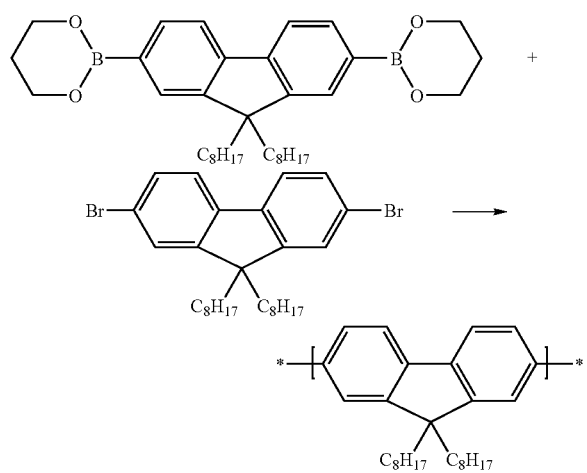

Example 1

Example 1 describes a method for synthesizing poly[2,7-(9,9-dioctylfluorene)] using a TPPMS water soluble ligand and palladium (Pd) in a molar ratio of 4:1. A dried bottom flask was purged with argon for 30 minutes. In this flask, 9,9-dioctylfluorene-2,7-bis-(trimethylborate) (1.18 g, 2.075 mmol), 9,9-dioctyl-2,7-dibromofluorene (1.12 g, 2.05 mmol), and sodium diphenylphosphinobenzene-m-sulphonate (TPPMS, 0.0474 g, 128 μmol) were dissolved in a mixture of toluene and aqueous 2M $Na_2CO_3$ (30/20 ml). The mixture was put under argon atmosphere and stirred for 30 minutes. Then palladium acetate (0.0072 g, 32.12 μmol) and 2 ml ethanol were added quickly. The mixture was refluxed with vigorous stirring for 48 h. The aqueous phase was then allowed to separate from the organic phase. The organic phase containing the polymer was poured into a pre-prepared solvent mixture containing hydrochloric acid (2.0%) and methanol under stirring and kept stirring for another 24 hour. The precipitated material was recovered by filtration, washed with methanol several times, then dried in a vacuum oven. Gel permeation chromatography (GPC) revealed the molecular weight of this polymer against the polystyrene standards to be about 85,226 by weight or 36,964 by number, respectively.

Example 2

Example 2 describes a method for making poly[2,7-(9,9-dioctylfluorene)] with a TPPMS ligand to Pd ratio of 8:1. The method of example 2 used the same procedure as in Example 1 except that the amount of TPPMS used was 0.0948 g TPPMS. GPC analysis indicated Mw was 15,395, and Mn was 11,018.

Example 3

Example 3 describes a method for making poly[2,7-(9,9-dioctylfluorene)] with a TPPMS ligand to Pd ratio of 16:1. In Example 3, the same procedure was used as in Example 1 except that the amount of TPPMS used was 0.0948 g and the amount of palladium acetate was 0.0036 g and no ethanol was added with the palladium. GPC analysis indicated Mw was 50,941 and Mn was 25,867.

Example 4

Example 4 describes a method for making poly[2,7-(9,9-dioctylfluorene)] with a TPPDS ligand to Pd ratio of 4:1. In Example 4 the same procedure was used as in Example 1 except that the ligand used was 3,3'-(phenylphosphinidene)bis-(benzenesulfonic acid), dipotassium salt (TPPDS 0.0638 g, 128 μmol). GPC analysis indicated Mw was 22,843 and Mn was 14,820.

Example 5

Example 5 describes a method for making poly[2,7-(9,9-dioctylfluorene)] with a TPPDS ligand to Pd ratio of 10:1. In Example 5 the same procedure was used as in Example 1 except 3,3'-(phenylphosphinidene)bis-(benzenesulfonic acid), dipotassium salt was used as a ligand (TPPDS 0.0822 g, 160 μmol) and the amount of palladium acetate used was 0.0036 g (16 μmol), without the addition of ethanol. GPC analysis indicated Mw was 30,199 and Mn was 17,332.

Example 6

Example 6 describes a method for making poly[2,7-(9,9-dioctylfluorene)] with a TPPTS ligand to Pd ratio of 6:1. In Example 6, the same procedure was used as in Example 1, except the ligand used was sodium triphenylphosphino-m-trisulfonate (TPPTS) in an amount of 0.109 g (192 μmol) and the palladium acetate was added in an amount of 0.0072 g (32 μmol), without addition of ethanol. GPC analysis indicated Mw was 35,274 and Mn was 27,645.

Examples 7-11 describe methods for manufacturing a high molecular weight poly[2,7-(9,9-dioctylfluorene)-co-N-(4-(3-methylpropyl)-diphenylaniline] according to the following chemical equation:

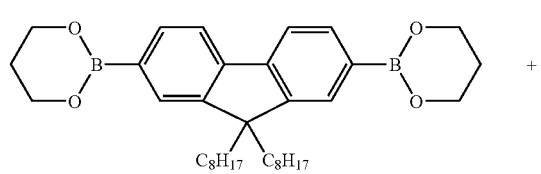

-continued

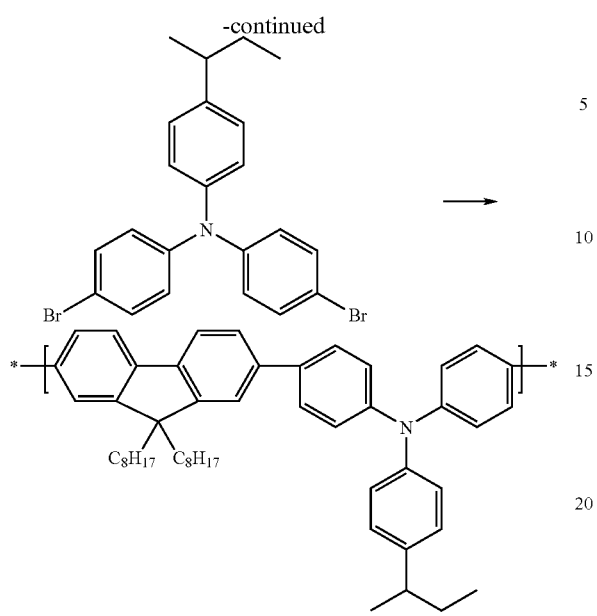

Example 7

Example 7 describes a method for synthesizing poly[2,7-(9,9-dioctylfluorene)-co-N-(4-(3-methylpropyl)-diphenylaniline] using a TPPMS ligand to Pd metal ratio of 6:1. A flask was purged with argon for 30 minutes. In this flask, 9,9-dioctylfluorene-2,7-bis-(trimethyleneborate) (1.18 g, 2.075 mmol), 4-(3-methylpropyl)-N,N-bis(4-bromophenyl)aniline (0.952 g, 2.075 mmol), and sodium diphenylphosphinobenzene-m-sulphonate (TPPMS, 0.018 g, 48 μmol), were dissolved in a mixture of THF and aqueous 2M $Na_2CO_3$ (42.5/20 ml). The solution was stirred under an argon atmosphere for 30 minutes. Then palladium acetate (0.0018 g, 8 μmol) was added quickly. The mixture was kept at 63° C. with vigorous stirring for 24 h (some precipitation of polymer was observed). The aqueous phase was then allowed to separate from the organic phase. The organic phase containing the polymer was poured into a pre-prepared solvent mixture containing hydrochloric acid (2.0%) and methanol stirred for another 24 hour. The precipitated material was recovered by filtration and washed with methanol several times then dried in an oven under vacuum. Gel permeation chromatography (GPC) revealed the molecular weight of this polymer against the polystyrene standards to be about Mw 230,000 by weight and Mn 180,000 by number.

Example 8

Example 8 describes a method for the synthesis of poly[2,7-(9,9-dioctylfluorene)-co-N-(4-(3-methylpropyl)-diphenylaniline] using a TPPMS to Pd ratio of 8:1. The method of Example 8 was performed using the same procedure as in Example 7 except that 0.024 g TPPMS and 0.0018 g palladium acetate were used. GPC analysis indicated Mw was 212,000 and Mn was 167,850.

Example 9

Example 9 describes a method for the synthesis of poly[2,7-(9,9-dioctylfluorene)-co-N-(4-(3-methylpropyl)-diphenylaniline] using a TPPDS to Pd ratio of 6:1. The method of Example 9 was performed using the same procedure as in Example 7 except that 0.0247 g TPPDS was used instead of TTPMS and 0.0018 g palladium acetate was used. GPC analysis indicated Mw was 320,100 and Mn was 254,000.

Example 10

Example 10 describes a method for the synthesis of poly[2,7-(9,9-dioctylfluorene)-co-N-(4-(3-methylpropyl)-diphenylaniline] using a TPPTS to Pd ratio of 6:1. The method of Example 10 was performed using the same procedure as in Example 7 except that 0.0272 g TPPTS was used instead of TTPMS and 0.0018 g palladium acetate was used. GPC analysis indicated Mw was 186,000, Mn was 143,200.

Example 11

Example 11 describes a method for the synthesis of poly[2,7-(9,9-dioctylfluorene)-co-N-(4-(3-methylpropyl)-diphenylaniline] using a TPPMS to Pd ratio of 12:1. A flask was purged with argon for 30 minutes. To this was added 9,9-dioctylfluorene-2,7-bis-(trimethyleneborate) (1.18 g, 2.075 mmol), 4-(3-methylpropyl)-N,N-bis(4-bromophenyl)aniline (0.952 g, 2.075 mmol), and sodium diphenylphosphinobenzene-m-sulphonate (TPPMS, 0.197 g, 384 μmol), which were dissolved in a mixture of toluene and aqueous 2M $Na_2CO_3$ (30/20 ml). The solution was stirred for 30 minutes under an argon atmosphere. Then palladium acetate (0.0072 g, 32 μmol) and 0.24 ml Aliquat 336 were added quickly. The mixture was refluxed with vigorous stirring for 48 h. The aqueous phase was then allowed to separate from the organic phase. The organic phase containing the polymer was poured into a pre-prepared solvent mixture containing hydrochloric acid (2.0%) and methanol with continued stirring for another 24 hour. The precipitated material was recovered by filtration and washed with methanol several times then dried in an oven under vacuum. GPC analysis indicated the polymer had a Mw of 9,000, and a Mn of 5,900.

Examples 12 and 13 describe methods for manufacturing a high molecular weight poly(9,9-dioctylfluorene-3,4-thiophene) according to the following chemical equation:

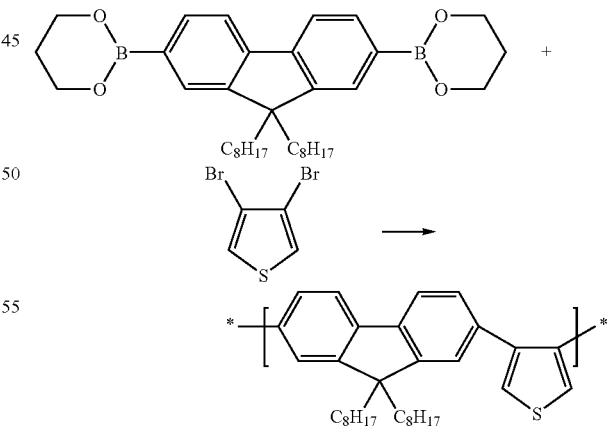

Example 12

Example 12 describes the synthesis of poly(9,9-dioctylfluorene-3,4-thiophene) using an exemplary method of the present invention. In a flask purged with argon, 9,9-dioctylfluorene-2,7-bis-(trimethyleneborate) (1.18 g, 2.075 mmol), 3,4-dibromothiophene (0.54 g, 2.075 mmol), and sodium diphenylphosphinobenzene-m-sulphonate (TPPMS, 0.018 g, 48 µmol), were dissolved in a mixture of THF and aqueous 2M $Na_2CO_3$ (30/20 ml). The solution was stirred for 30 minutes under an argon atmosphere. Then palladium acetate (0.0072 g, 32 µmol) was added quickly. The mixture was refluxed with vigorous stirring for 24 h. The aqueous phase was then allowed to separate from the organic phase. The organic phase containing the polymer was poured into a pre-prepared solvent mixture containing hydrochloric acid (2.0%) and methanol and stirred continuously for another 24 hour. The precipitated material was recovered by filtration and washed with methanol several times then dried in an oven under vacuum. The GPC analysis indicated the polymer had a Mw of 102,900 and Mn of 77,300.

Example 13

Example 13 describes the synthesis of poly(9,9-dioctylfluorene-3,4-thiophene) using a TPPTS to Pd ratio of 6:1. The method of Example 13 was performed using the same procedure as in Example 12 except that sodium triphenylphosphino-m-trisulfonate (TPPTS 0.0545 g, 96 µmol) was used instead of TPPMS and palladium acetate (0.0036 g, 16 µmol) was used without the addition of ethanol. GPC analysis indicated Mw was 65,240, and Mn was 51,650.

Examples 14 and 15 describe methods for manufacturing a high molecular weight poly(9,9-dioctylfluorene-co-benzothiadiazole) according to the following chemical equation:

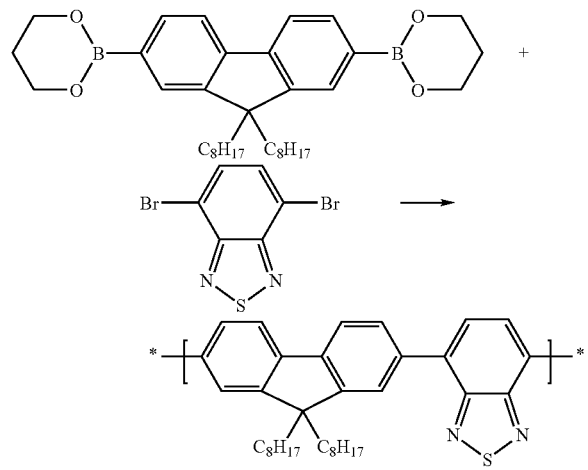

Example 14

Example 14 describes the synthesis of poly(9,9-dioctylfluorene-co-benzothiadiazole). A flask was purged with inert gas, to which 4,7-dibromo-2,1,3-benzothiadiazole (0.61 g, 2.075 mmol), 9,9-dioctylfluorene-2,7-bis-(trimethyleneborate) (1.18 g, 2.075 mmol), sodium diphenylphosphinobenzene-m-sulphonate (TPPMS, 0.018 g, 48 µmol) and a mixture containing of 30 ml THF and 20 ml 2M sodium carbonate were added. The solution was stirred for 30 minutes under an argon atmosphere. Then palladium acetate (0.0072 g, 32 µmol) was added quickly. The mixture was refluxed with vigorous stirring for 24 h. Then the mixture was poured into a pre-prepared solvent mixture containing hydrochloric acid (2.0%) and stirred continuously for another 24 hour. The precipitated material was recovered by filtration and washed with methanol several times then dried in an oven under vacuum. GPC analysis indicated that the polymer had a Mw of 82,600 and a Mn of 54,900.

Example 15

Example 15 describes the synthesis of poly(9,9-dioctylfluorene-co-benzothiadiazole) using a TPPDS to Pd ratio of 6:1. The method of Example 15 used the same procedure as Example 14 except that 0.0247 g TPPDS were used instead of TPPMS and 0.0018 g palladium acetate were used. GPC analysis indicated that the polymer had a Mw of 80,100, and a Mn of 52,000.

The aryl-aryl coupling reaction in the Examples demonstrate that the method of the present invention using water soluble noble metal catalyst complexes can be used to manufacture polymers with high molecular weights. In addition, the processes of the foregoing examples had very good yields (e.g. 90-95%). Furthermore the high molecular weight and good yields were achieved without an excess of an aryl-boron compound.

The use of a water-soluble catalyst complex in the reaction medium according to the present invention makes it possible to perform a very efficient separation between the catalyst and the polymer product. Residual catalyst remaining in the polymer in the Examples of the present invention was typically less than 100 ppm. In addition, the catalyst remaining in the hydrophilic can, in some cases, be reused in subsequent reactions, thereby reducing the cost of the overall process.

The polymers manufactured according to the invention can be used in electronic components such as organic light-emitting diodes (OLEDs), organic integrated circuits (O-ICs), organic field-effect transistors (OFETs), organic thin-film transistors (OTFTs), organic solar cells (O-SCs), organic laser diodes (O-lasers), organic color filters for liquid crystal displays or organic photoreceptors, to which the present invention also relates. Those skilled in the art are familiar with techniques for making the foregoing electrical components using aryl-aryl coupled polymers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for manufacturing polymers through an aryl-aryl coupling reaction, comprising:
preparing a reaction medium comprising an aqueous phase and an organic phase;
dispersing a water-soluble catalyst in the aqueous phase, the water-soluble catalyst comprising organic ligands complexed with noble metal atoms, the water-soluble catalyst having a greater solubility in the aqueous phase than in the organic phase, wherein the organic ligands are selected from the group consisting of trialkylphosphines, tricycloalkylphosphines, triarylphosphines, dialkylaryiphosphines, alkyldiarylphosphines, heteroarylphosphines, phosphites, phosphinous esters, phosphols, dibenzophosphols, cyclic oligocyclic, polycyclic compounds containing phosphorus atoms, bipyridines, phenanthrolines, porphyrins, alizarins, and combinations thereof, and where the organic ligands further include at least one functional group selected from the group consisting of sulfonic acid groups, carbonic acid groups, phosphonic acid groups, phosphonium groups, peralkylammonium groups, hydroxy groups, and combinations thereof;

forming a polymer having a molecular weight greater than about 1000 g/mol by:
(i) adding at least one polymerizable monomer to the reaction mixture; and
(ii) mixing the aqueous phase with the organic phase to cause polymerization of the at least one monomer through an aryl-aryl coupling reaction catalyzed by the water-soluble catalyst, thereby yielding a polymer having a molecular weight greater than 1000 g/mol, the polymer having a greater solubility in the organic phase than in the aqueous phase;

separating at least a portion of the water soluble catalyst from the polymer by allowing the aqueous phase to separate from the organic phase; and recovering the polymer from the organic phase.

2. A method as in claim 1, wherein the polymer has a molecular weight greater than about 8,000 g/mol.

3. A method as in claim 1, wherein the polymer has a molecular weight greater than about 50,000 g/mol.

4. A method as in claim 1, wherein the plurality of organic ligands are selected from the group consisting of TPPMS, TPPDS, TPPTS, Amphos, BISBI, Phen, and combinations thereof.

5. A method as in claim 1, wherein the at least one monomer is hydrophobic.

6. A method as in claim 1, further comprising a second monomer and wherein the catalyzed polymerization yields a heteropolymer.

7. A method as in claim 6, wherein the monomers comprise hydrophobic and hydrophilic monomers.

8. A method as in claim 1, wherein the water-soluble catalyst is formed in-situ by dispersing the organic ligands and a noble metal salt in the reaction mixture.

9. A method as in claim 1, wherein the noble metal comprises palladium.

10. A method as in claim 1, wherein the ligand to metal ratio is in a range from about 2:1 to about 15:1.

11. A method as in claim 1, further comprising dispersing a base in the aqueous phase.

12. A method as in claim 11, wherein the molecular weight of the polymer is greater than about 8,000 g/mol.

13. A method as in claim 11, wherein the water-soluble catalyst is reused in a subsequent polymerization reaction.

14. A method as in claim 11, wherein the plurality of organic ligands are selected from the group consisting of TPPMS, TPPDS, TPPTS, Amphos, BISBI, Phen, and combinations thereof.

15. A method as in claim 11, wherein the organic phase comprises one or more solvents selected from the group consisting of hexane, isohexane, heptane, cyclohexane, benzene, toluene, xylene, hexanol, anisole, THF, and combinations thereof.

16. A method as in claim 11, wherein the water-miscible organic solvent comprises one or more solvents selected from the group consisting of esters, nitrites, tertiary alcohols, sulphoxides, amides, carbonates, dioxane, tetrahydrofuran, ethylene glycol ether, DME, and combinations thereof.

17. A method as in claim 11, wherein the at least one monomer is selected from the group consisting of boron-containing compounds, aromatic halogen compounds and perfluoroalkysulfonates.

18. A method as in claim 1, the method yielding a polyarylene or a polyheteroarylene and further comprising cross-coupling an aromatic boron-containing compound with an aromatic halogen compound or perfluoroalkysulfonate under palladium catalysis in the presence of a least one water-soluble complexing ligand to yield a polyarylene or a polyheteroarylene having a molecular weight greater than 1000 g/mole.

19. A method as in claim 18, wherein, subsequent to formation of the polyarylene or polyheteroarylene, at least a portion of the water-soluble complexing ligands are separated from the polyarylene of polyheteroarylene by allowing the aqueous and organic phases to separate.

20. A method as in claim 18, wherein the aromatic boron-containing compound, aromatic halogen compound or perfluoroalkysulfonate is selected from the group consisting of 9,9-dioctylfluorene-2,7-bis-(trimethylborate), 9,9-dioctyl-2,7-dibromofluorene, 4-(3-methylpropyl)-N, N-bis(4-bromophenyl)aniline, 3,4-dibromothiophene, 4,7-dibromo-2,1,3-benzothiadiazole, and combinations thereof.

21. A method as in claim 1, the organic phase further comprising an organic solvent with a water solubility greater than 5%.

22. A method as in claim 21, wherein the organic solvent comprises THF.

23. A method as in claim 21, wherein at least about 75% of the polymer is dissolved in the organic solvent.

24. A method as in claim 21, wherein the organic solvent and polymer form a solution having a solubility in the aqueous phase that is less than 10%.

* * * * *

UNITED STATES PATENT AND TRADEMARK OFFICE
CERTIFICATE OF CORRECTION

PATENT NO.        : 7,547,757 B2
APPLICATION NO.   : 11/461608
DATED             : June 16, 2009
INVENTOR(S)       : Liu et al.

It is certified that error appears in the above-identified patent and that said Letters Patent is hereby corrected as shown below:

Column 3
Line 46, add --,-- after "below"
Line 60, add --,-- after "thereof"

Column 7
Line 61, add --,-- after "necessary"

Column 8
Line 33, change "that as a result of the first step" to --that, as a result of the first step,--
Line 42, add --,-- after "say"

Column 9
Line 62, change "hour." to --hours.--

Column 11
Line 45, change "methanol stirred" to --methanol and was stirred--
Line 46, change "hour." to --hours.--

Column 12
Line 35, change "hour." to --hours.--

Column 13
Line 13, change "hour." to --hours.--

Column 14
Line 1, change "hour." to --hours.--
Line 61, change "dialkylaryiphosphines." to --dialkylarylphosphines.--

UNITED STATES PATENT AND TRADEMARK OFFICE
CERTIFICATE OF CORRECTION

PATENT NO. : 7,547,757 B2
APPLICATION NO. : 11/461608
DATED : June 16, 2009
INVENTOR(S) : Liu et al.

It is certified that error appears in the above-identified patent and that said Letters Patent is hereby corrected as shown below:

Column 16
Line 3, change "Phen,and" to --Phen, and--

Signed and Sealed this

Twenty-second Day of December, 2009

David J. Kappos
*Director of the United States Patent and Trademark Office*